United States Patent [19]

Kirk et al.

[11] Patent Number: 4,791,372
[45] Date of Patent: Dec. 13, 1988

[54] CONFORMABLE HEAD OR BODY COIL ASSEMBLY FOR MAGNETIC IMAGING APPARATUS

[75] Inventors: Gregory L. Kirk, Palo Alto, Calif.; Jeffrey D. Mewborne, San Antonio, Tex.; David M. Parish, Sunnyvale, Calif.

[73] Assignee: Resonex, Inc., Sunnyvale, Calif.

[21] Appl. No.: 86,368

[22] Filed: Aug. 17, 1987

[51] Int. Cl.⁴ ............................................. G01R 33/20
[52] U.S. Cl. ................................... 324/318; 324/322
[58] Field of Search .............. 324/318, 322, 307, 309; 128/653

[56] References Cited

U.S. PATENT DOCUMENTS

| | | | |
|---|---|---|---|
| 4,617,936 | 10/1986 | Malko | 324/309 |
| 4,621,237 | 11/1986 | Timms | 324/318 |
| 4,636,730 | 1/1987 | Bottomley | 324/322 |
| 4,680,549 | 7/1987 | Tanttu | 324/318 |

FOREIGN PATENT DOCUMENTS

| | | | |
|---|---|---|---|
| 61-59806 | 8/1984 | Japan | 324/307 |
| 8701199 | 7/1986 | PCT Int'l Appl. | |

*Primary Examiner*—Stewart J. Levy
*Assistant Examiner*—Louis M. Arana
*Attorney, Agent, or Firm*—Flehr, Hohbach, Test, Albritton & Herbert

[57] ABSTRACT

A pickup coil for magnetic resonance imaging (MRI) includes a single thin metal copper sheet which is covered with cloth-like material with the interior of the two ends of the coil being covered with VELCRO-type connective material so that they adhere together. Thus, this provides a conforming fit to various specimens of varying diameters and configurations. The two ends of the coil are held by and inserted in a capacitive tuning unit which compensates for the resistive loading caused by the specimen and also for implementing the needed resonance condition.

7 Claims, 3 Drawing Sheets

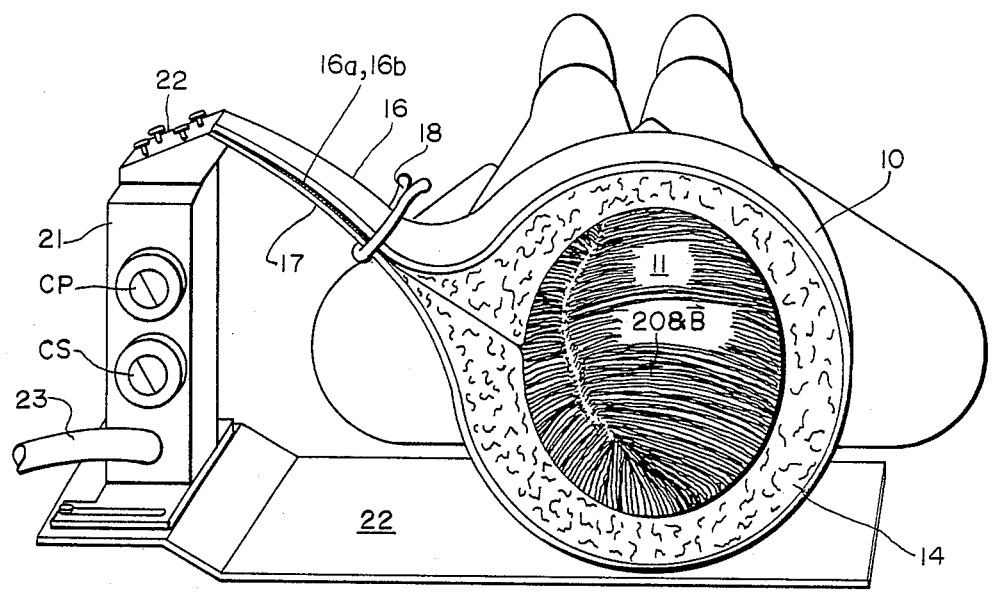
FIG.—1
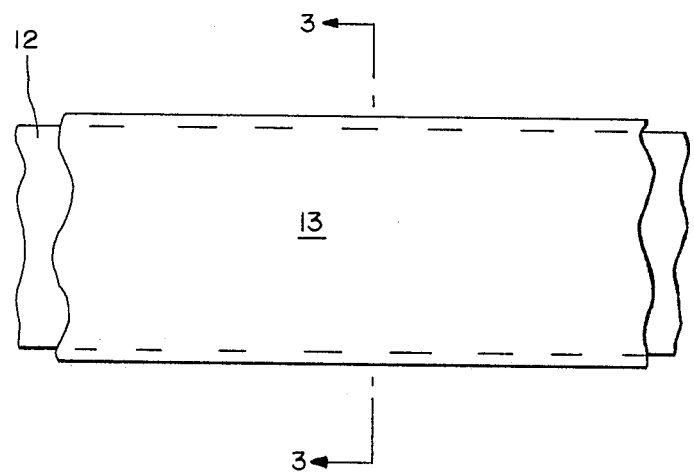
FIG.—2

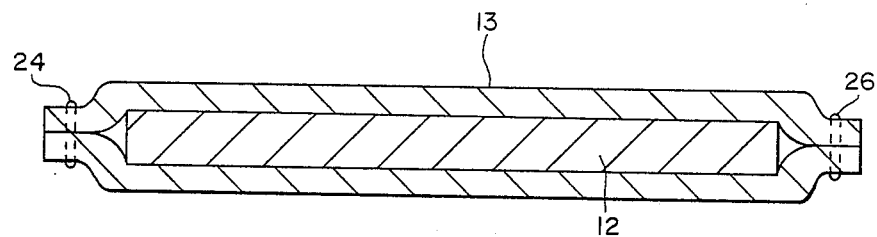
FIG.—3
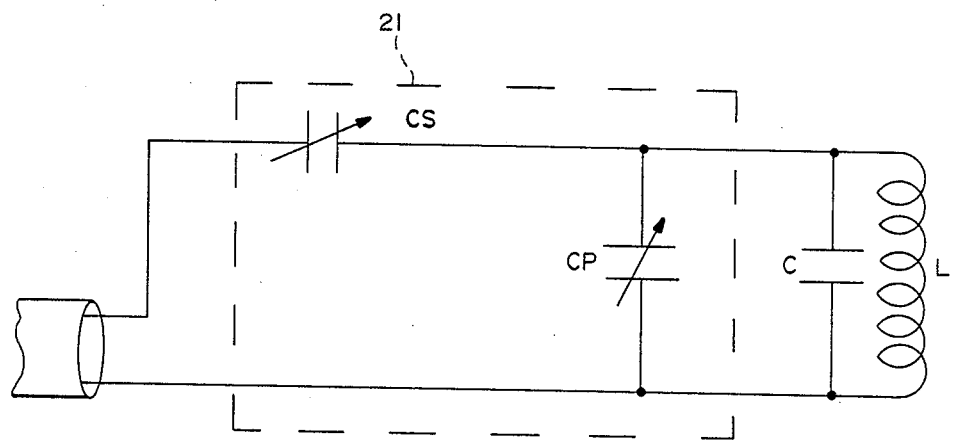
FIG.—4

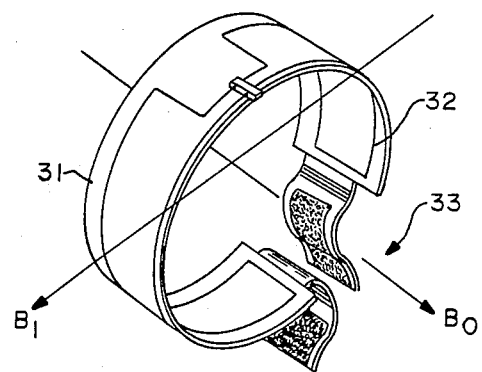
(PRIOR ART)
FIG.—5
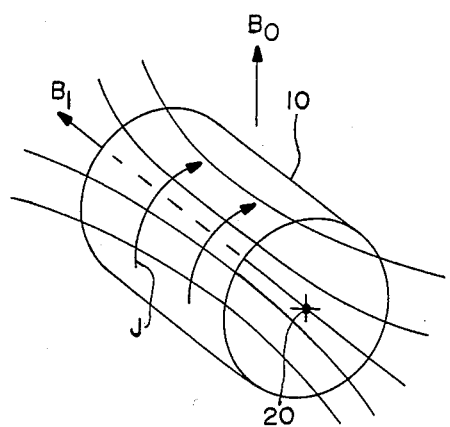
FIG.—6

CONFORMABLE HEAD OR BODY COIL ASSEMBLY FOR MAGNETIC IMAGING APPARATUS

The present invention is directed to a head or body coil assembly for picking up free induction decay or spin-echo signals from a test specimen (for example, human) produced by a magnetic resonance imaging (MRI) apparatus. More particularly, it is suitable for test specimens of varying diameter configuration.

BACKGROUND OF THE INVENTION

Head or body coils are necessary in MRI apparatus. They are commonly used both for providing radio frequency (RF) excitation signals and thereafter receiving a spin-echo or free induction decay signal indicating a characteristic of the specimen being examined. Since the so-called pickup signal is of a very small magnitude, it is important to maximize the signal above the ambient noise level. It is also desirable that the specimen or human patient (which inevitably comes in various sizes and shapes, depending on the body portion being imaged) uniformly fill the coil structure in an optimal manner.

FIG. 5 illustrates a prior art coil of the saddle type where two separate coils provide a magnetic field vector B1 through the effective centers of the coils with the main magnetic field, Bo, lying along a centerline. The associated Velcro fastening thus shifts the field vector depending on the size of the body portion.

OBJECT AND SUMMARY OF THE INVENTION

Thus it is an object of the present invention to provide an improved head or body coil for MRI apparatus.

In accordance with the above object, there is provided a head or body coil assembly for picking up free induction decay or spin-echo signals from a test specimen produced in a magnetic resonance imaging apparatus. It comprises an inductive pickup coil means for substantially surrounding the test specimen, including a thin, flexible, unitary, continuous band of conductive material substantially entirely covered with a flexible protective material. The band has a pair of ends with their facing interiors being provided with mutually adhering surfaces which, when fastened together, provides a conforming fit of the band around the specimens of varying diameter and configuration.

BRIEF DESCRIPTION OF DRAWINGS

FIG. 1 is a perspective view showing a head coil assembly in use on a human patient.

FIG. 2 is a simplified plan view of an inductive pickup coil embodying the present invention.

FIG. 3 is a cross section taken along line 3—3 of FIG. 2.

FIG. 4 is a circuit schematic showing the overall circuit of the assembly embodying the present invention.

FIG. 5 is a perspective view of a prior art coil.

FIG. 6 is a simplified perspective view of the coil of FIG. 1.

DESCRIPTION OF PREFERRED EMBODIMENT

FIG. 1 illustrates the inductive pickup coil 10 as it is surrounding the test specimen which, in this case, is a human head 11. As illustrated in greater detail in FIG. 2, the pickup coil consists of a band of copper metal 12 in the form of a very thin flexible sheet which is covered by a sleeve 13 of cloth material. This is both for insulating purposes and for the patient's comfort. To provide for uniform spacing of the head or whatever specimen it may be from the pickup coil 10, there is a flexible non-magnetic material 14 wrapped around the head 11, around which the coil 10 is placed. For example, it might be a sponge-like material.

The two ends of the pickup coil 10 which are designated 16 and 17 have adhered or placed on their interior facing portions a hook and loop type fastener 16a, 16b, such as VELCRO. This causes the flexible pickup coil 10 to adhere or provide a conforming fit around the head 11, or for that matter any other body part, and to accommodate varying configurations and diameters. To insure that the adherence of the ends 16 and 17 is secured, a plastic clip 18 can be provided where the force causing the two ends 16 and 17 to pull apart would be greatest.

Thus, to summarize the pickup coil, it is formed of a continuous band of thin copper material 12 (or any other conductive material), is substantially entirely covered with protective cloth 13, and by the use of VELCRO fastening 16a and 16b provides a conforming fit. The ends 16 and 17 are electrically connected to a capacitive tuning unit 21 by means of the connector block 22 into which the ends and specifically the metallic band portions are inserted and held. This provides a very low resistance connection to allow easy tuning of the LC portions of the circuit to a resonance condition. The capacitive tuning unit 21 contains as shown two adjustments—one for parallel capacitance $C_p$ and one for series capacitance $C_s$. It is located on the same platform 22 as is the patient's head 11 and the coil 10. In other words it is in very close proximity. Unit 21 compensates for the resistive loading caused by the specimen and especially specimens of different resistive values. In addition, the resonance condition of the circuit is adjusted so that, as is well known in MRI technology, the circuit is adjusted toward the resonance of the particular Larmor frequency being picked up.

The output of capacitive tuning unit 21 is a coaxial cable 23 which extends to the remaining processing circuitry. Details of this, such as an electronic switch by which an RF excitation pulse can be provided to the coil, and also a phase detector by which tuning can be more effectively accomplished is illustrated in the copending application Ser. No. 890,603 filed July 25, 1986, with James G. Holbrook and Otto J. Jaks as inventors entitled "Head or Body Coil Assembly for Magnetic Resonance Imaging Apparatus," and assigned to the present assignee. In that application a continuous band of conductive material is also utilized as the pickup coil. However, there is no specific closure or fastener shown and in its preferred embodiment it is a fixed type of structure. In the above application tuning is accomplished in two steps with a proximate unit to the coil and then a remote unit at the end of a transmission line or coaxial cable.

FIG. 3 shows the cloth material 13 covering the copper sheet 12 with the cloth of course being sewn together or fixed by glue at its ends 24 and 26.

The overall circuit of the assembly is illustrated in FIG. 4 with the pickup coil itself having an inductance L and a capacitance C which is generally due to the adhered ends 16 and 17. Then the tuning unit 21 is shown in dashed outline as including the tunable series capacitor $C_s$ and the parallel capacitor $C_p$. In practice this tuning is accomplished, as discussed briefly above in connection with the co-pending application, by utilizing a phase detector to tune a signal for a maximum amplitude and an in phase condition.

The improved head or body coil of the present invention, while conforming to fit around the head or other body part, does so while still maintaining an efficient and minimum loading configuration with relation to magnetic field $B_1$ vs. current, J. Referring to the simplified perspective of coil 10 in FIG. 6, ideally the geometrical axis 20 of the cylindrical configuration of coil 10 should always substantially coincide with the solenoidal magnetic field axis $B_1$ produced by current, J, flowing in the coil or in response to a magnetic field in the direction indicated. The main magnetic field is shown in Bo. In addition, referring to FIG. 1 where the substantial coincidence of these two axes is also indicated by 20 and the letter 'B,' the above is provided since the active part of the pickup coil is the cylindrical conforming part with the remaining excess ends 16 and the 17 merely acting as a capacitor which can easily be compensated for. In other words, when fastened together to provide a conforming fit, the effective pickup portion or the cylindrical solenoidal portion is the conforming part of the coil.

The width of the coil can also be adjusted for greatest efficiency and minimum loading if desired by choosing different width strips. Loading is minimized by limiting the RF magnetic field strength at locations of the specimen above or below the coil cylinder (N 2-3 strip widths). This reduces the power dissipation from induced eddy currents in the body, which reduces thermal noise. The foregoing choosing of the width must, of course, be consistent with a desired imaging field of view.

In contrast, the prior art showing in FIG. 5 has a pickup or transmission coil which has its magnetic field B in a direction where the field vector is through the effective centers of the two coils. Ideally, this coil is used in a magnetic resonance imaging machine of the supercooled type where the major magnetic field is in a direction different from that of the non-supercooled machine in which the present invention is utilized. In other words, the magnetic field $B_1$ in the present invention is parallel to the Z or body axis of a patient, whereas in the "saddle type" coil of FIG. 5 it is perpendicular. The coil in FIG. 5 does include a Velcro fastener but of a different type where one Velcro covered strap overlaps another so that the active ends of the coils themselves may never overlap. Furthermore, from a magnetic field standpoint, the ideal alignment of the coils 31 and 32 is with the center of the coils (through which $B_1$ passes) 180 phase degrees apart and with edge to edge spacing of 60° (of the adjacent coil edges) for maximum magnetic field uniformity. This alignment is only applicable at one adjustment of the closure and thus other closures are either inefficient or cause errors.

Thus, an improved head or body coil assembly for MRI use has been provided.

What is claimed is:

1. A head or body coil assembly having a predetermined magnetic axis for picking up free induction decay or spin-echo signals from a test specimen produced in a magnetic resonance imaging apparatus comprising:

inductive pickup coil means for substantially surrounding said test specimen including a thin, flexible, unitary, continuous band of conductive material substantially entirely covered with a flexible protective material, said band having a pair of ends with their facing interiors provided with mutually adhering surfaces which, when fastened together, provide a conforming fit of said band around specimens of varying diameter and configuration, said band being substantially cylindrical in configuration and having a central axis substantially coincident with said magnetic axis, said adhered ends forming an effective capacitor.

2. An assembly as in claim 1 including capacitive tuning means, located in close proximity to said coil means into which said ends are inserted and held to form a low resistance contact, for compensating for the resistive loading caused by said specimen.

3. An assembly as in claim 1 where said mutually adhering surfaces consist of hook and loop type connection means.

4. An assembly as in claim 1 where said protective material is cloth.

5. An assembly as in claim 1 including means for uniformly spacing said band from said specimen.

6. An assembly as in claim 1 where said adhered ends include clip means for insuring such adhering.

7. An assembly as in claim 1 where said band has a width along said central axis to minimize loading consistent with a desired imaging field of view.

* * * * *